United States Patent [19]

Nelson

[11] Patent Number: 5,790,411
[45] Date of Patent: Aug. 4, 1998

[54] EQUIPMENT FOR TESTING ELECTRONIC CIRCUITRY

[75] Inventor: Alan John Nelson, Dunfermline, United Kingdom

[73] Assignee: Marconi Instruments Limited, Stevenage, United Kingdom

[21] Appl. No.: 740,677

[22] Filed: Oct. 31, 1996

[30] Foreign Application Priority Data

Nov. 6, 1995 [GB] United Kingdom ............ 9522694

[51] Int. Cl.$^6$ .................................................. G01R 31/28
[52] U.S. Cl. ............... 364/481; 364/579; 364/551.01; 364/550; 364/267.4; 324/73.1; 324/158.1; 324/763; 324/555; 371/27.1; 371/3; 371/22.1
[58] Field of Search ............... 364/481, 480, 364/550, 551.01, 579, 580, 267.4, 267, DIG. 1; 321/22.1, 22.6, 22.36, 24, 25.1, 21.1, 3, 27.1; 395/183.01, 183.22, 183.08; 324/763, 73.1, 555, 76.11, 537, 158.1

[56] References Cited

U.S. PATENT DOCUMENTS

| | | |
|---|---|---|
| 4,216,539 | 8/1980 | Raymond et al. ............... 371/22.6 |
| 4,402,055 | 8/1983 | Lloyd et al. . | 
| 4,686,628 | 8/1987 | Lee et al. . |
| 4,692,920 | 9/1987 | Tannhaeuser et al. ............... 371/27.6 |
| 5,459,738 | 10/1995 | Watari ............... 371/27.1 |
| 5,596,537 | 1/1997 | Sukegawa et al. ............... 365/201 |
| 5,627,478 | 5/1997 | Habersetzer et al. ............... 324/763 |

*Primary Examiner*—James P. Trammell
*Assistant Examiner*—Tuan Q. Dam
*Attorney, Agent, or Firm*—Spencer & Frank

[57] ABSTRACT

An equipment for testing electronic circuitry comprising: test connections to said circuitry; measurement means for generating test signals for application to said circuitry and monitoring response signals produced by the circuitry in response to the test signals, said test signals being applied and said response signals being received by way of said test connections; switches for switching the test signals generated to said test connections and the response signals produced to said measurement means; means defining the settings of said switches for a current test of a series of tests required to be performed on said circuitry; first memory means for storing the switch settings for the next test of said series following said current test; second memory means for storing the switch settings for the entire series of tests; and sequencer means for transferring (i) the next switch settings from said first memory means to said means defining and (ii) the switch settings for the test of said series following said next test from said second memory means to said first memory means, said sequencer means initiating the transferring in response to the receipt of a trigger signal from said measurement means indicating that test signals for said next test will be applied to said circuitry after a predetermined time.

6 Claims, 2 Drawing Sheets

1

EQUIPMENT FOR TESTING ELECTRONIC CIRCUITRY

This invention relates to an equipment for testing electronic circuitry.

One known such equipment comprises: test pin connections to the circuitry being tested; an in-circuit measurement system for generating test signals for application to the circuitry and monitoring response signals produced by the circuitry in response to the test signals, the test signals being applied and the response signals being received by way of the test pin connections; a matrix of relay switches for switching the test signals generated to the test pin connections and the response signals produced to the in-circuit measurement system; in respect of each relay switch a relay driver for operation thereof; in respect of each relay driver a latch which controls the operation of the driver; and a computer processing unit which sends to the latches the relay switch settings for each test of a series of tests required to be performed on the electronic circuitry.

Once the known equipment has completed a current test, i.e. once the in-circuit measurement system has completed its monitoring of the signals produced in response to the test signals applied in the current test, the measurement system instructs the computer processing unit to calculate the relay switch settings for the next test of the series. The computer processing unit then sequentially clocks the calculated switch settings into the latches, i.e. it clocks each latch in turn. The in-circuit measurement system then sends the test signals for the next test.

It is an object of the present invention to provide an equipment for testing electronic circuitry wherein the time taken to perform a series of tests is reduced.

According to the present invention there is provided an equipment for testing electronic circuitry comprising: test connections to said circuitry; measurement means for generating test signals for application to said circuitry and monitoring response signals produced by the circuitry in response to the test signals, said test signals being applied and said response signals being received by way of sad test connections; switches for switching the test signals generated to said test connections and the response signals produced to said measurement means; means defining the settings of said switches for a current test of a series of tests required to be performed on said circuitry; first memory means for storing the switch settings for the next test of said series following said current test; second memory means for storing the switch settings for the entire series of tests; and sequencer means for transferring (i) the next switch settings from said first memory means to said means defining and (ii) the switch settings for the test of said series following said next test from said second memory means to said first memory means, said sequencer means initiating the transferring in response to the receipt of a trigger signal from said measurement means indicating that test signals for said next test will be applied to said circuitry after a predetermined time.

An equipment for testing electronic circuitry in accordance with the present invention will now be described, by way of example, with reference to the accompanying drawings, in which.

Figure 1:
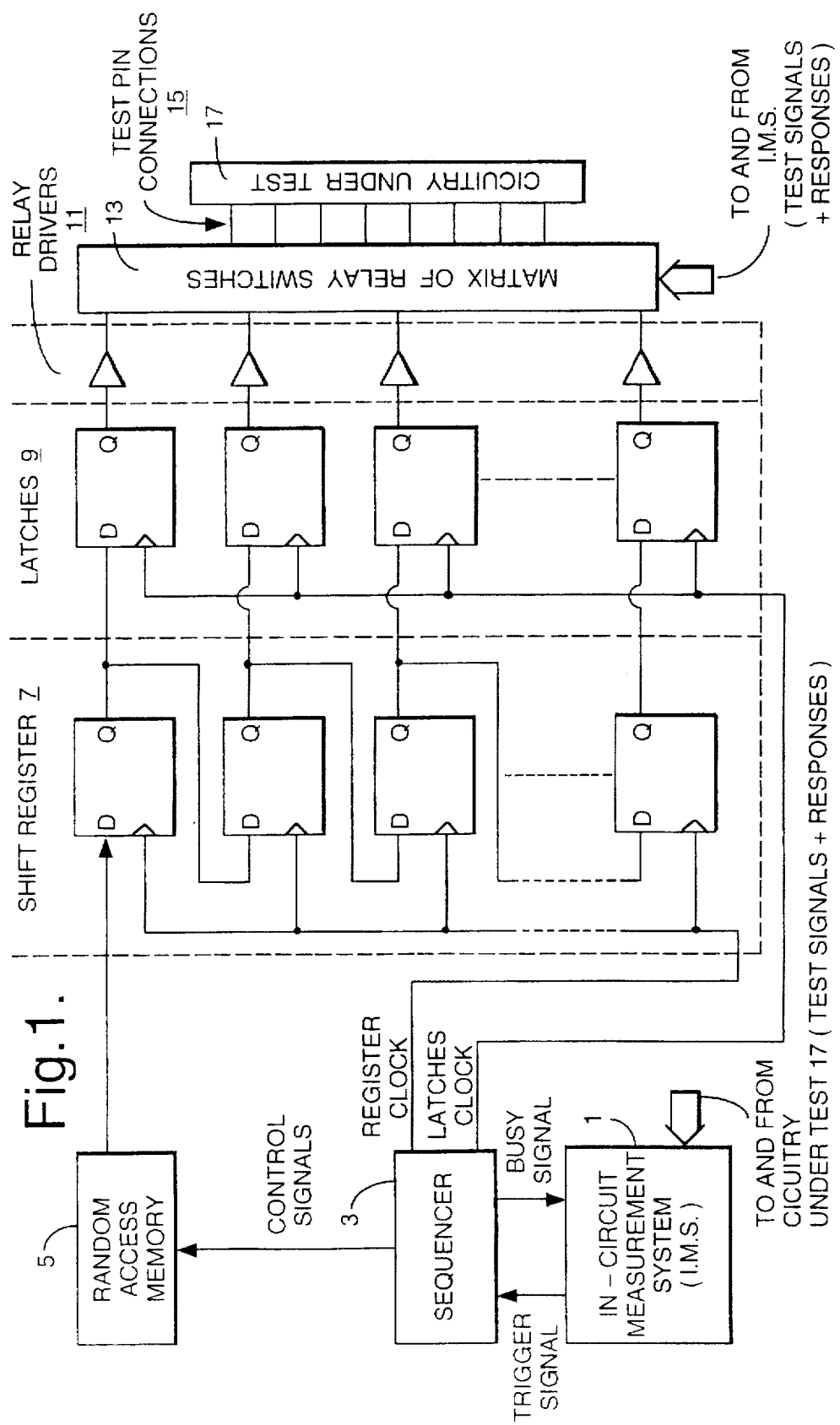
FIG. 1 is a block schematic diagram of the equipment.

Referring to FIG. 1, the equipment comprises an in-circuit measurement system (IMS) 1, a sequencer 3, a random access memory (RAM 5, a shift register 7, relay latches 9, relay drivers 11, a matrix of relay switches 13, and test pin connections 15 to the circuitry under test 17.

IMS 1 controls, overall, the series of tests performed on circuitry 17. It communicates with sequencer 3, generates test signals for application to circuitry 17, and analyses responses to test signals received from circuitry 17. The purpose of the communication with sequencer 3 is to enable IMS 1 and sequencer 3 to operate concurrently. IMS 1 sends to sequencer 3 a trigger signal to initiate operation of sequencer 3. Whilst in operation sequencer 3 sends to IMS 1 a busy signal.

Sequencer 3 controls the operation of RAM 5, shift register 7, and relay latches 9.

RAM 5 stores the switch settings for matrix of relay switches 13 for each test of the entire series of tests required to be performed on circuitry 17.

Shift register 7 stores the switch settings for the next test of the series following a current test The number of flip-flops comprising shift register 7 equals the number of switches in matrix 13. Sequencer 3 sends control signals to RAM 5 to cause it to supply to shift register 7 the switch settings for the next test Sequencer 3 clocks shift register 7 a sufficient number of times to shift the next test switch settings into register 7.

Relay latches 9 store the switch settings for the current test of the series. The number of latches 9 equals the number of switches in matrix 13. Sequencer 3 transfer the next test switch settings from shift register 7 to relay latches 9 by clocking simultaneously latches 9.

There is one relay driver 11 in respect of each switch of matrix 13. Each driver 11 provides the current required to energise the coil of its respective switch to close the switch.

Matrix of relay switches 13 routes test signals generated by IMS 1 to the test pin connections 15 which contact the points of the circuit being tested where it is desired to apply the test signals. Matrix 13 also routes response signals to IMS 1 from the test pin connections 15 which contact the points of the circuit from which it is desired to receive response signals. For each test of the entire series of tests required to be performed, there is a respective configuration of switch settings. As mentioned previously, all the configurations are stored in RAM 5.

Figure 2:
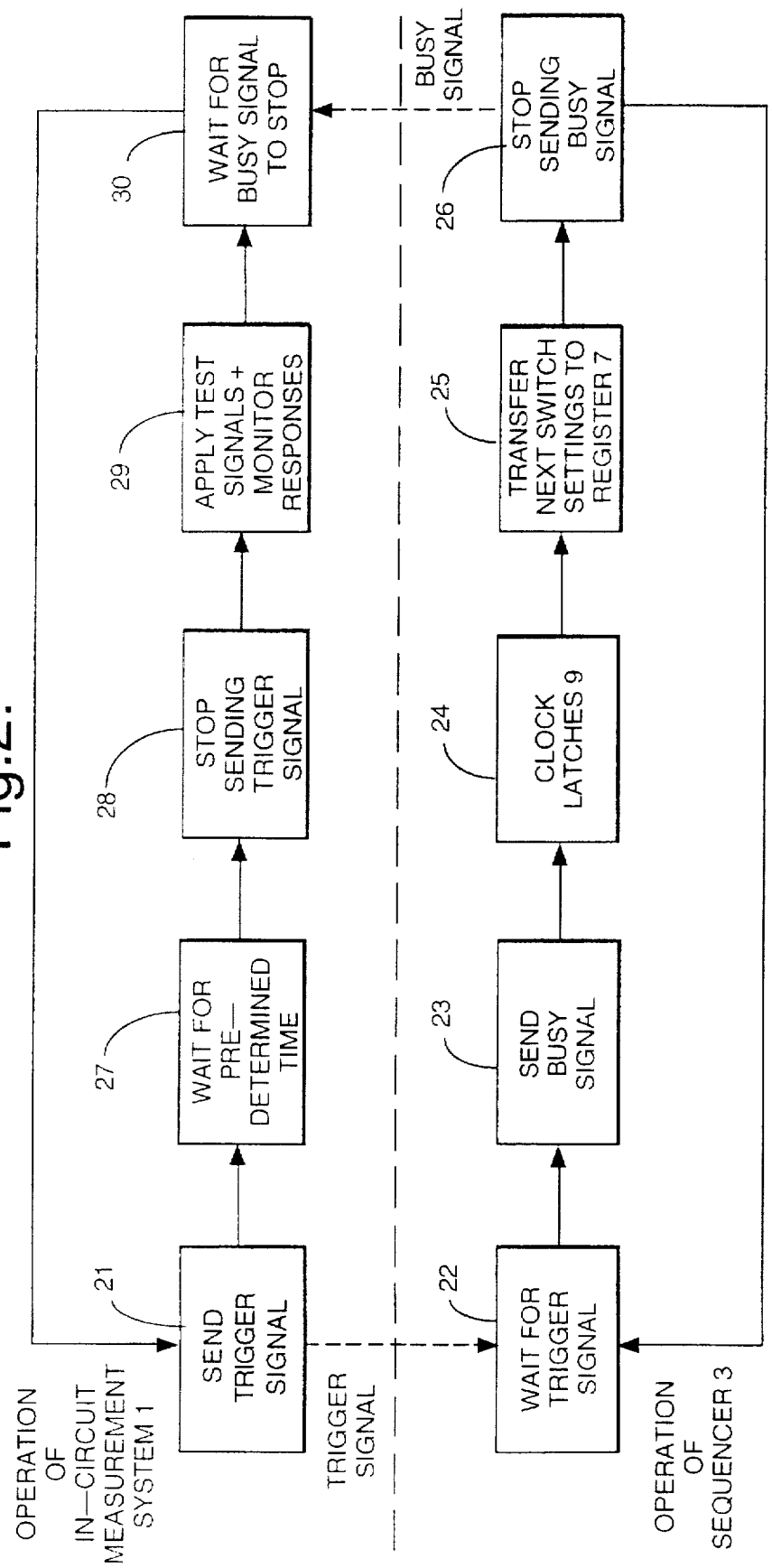
FIG. 2 illustrates the operation of the equipment.

Referring also to FIG. 2, in operation in order to achieve the making of a test of the series, IMS 1 sends to sequencer 3 a trigger signal, i.e. IMS 1 sends a logic level '1' to sequencer 3 (step 21). Sequencer 3, which is waiting to receive a trigger signal, i.e. is waiting to receive a logic level '1' (step 22), upon receipt sends a busy signal to IMS 1, i.e. sends a logic level '1' to IMS 1 (step 23). Sequencer 3 then clocks latches 9 to transfer from shift register 7 to latches 9 the switch settings for the test of the series to be made (step 24). Sequencer 3 then sends control signals to RAM 5 to cause it to supply to shift register 7 the next test switch settings, and clocks these settings into register 7 (step 25). Having done this, sequencer 3 stops sending the busy signal to IMS 1, i.e. it sends a logic level '0' to IMS 1 (step 26). Sequencer 3 then returns to the state in which it is waiting for a trigger signal (step 22).

Returning to IMS 1, following the sending of the trigger signal to sequencer 3, IMS 1 waits for a predetermined dine to enable matrix of switches 13 to be switched by sequencer 3 (see step 24 above) and settle (step 27). IMS 1 then stops sending the trigger signal to sequencer 3, i.e. it sends a logic level '0' to sequencer 3 (step 28). IMS 1 then generates and sends the test signals for the test of the series being made, and receives and analyses the responses to these test signals (step 29). The test signals are sent and the response signals are received by way of matrix 13 and pin connections 15 IMS 1 then waits for sequencer 3 to stop sending the busy signal, i.e. it waits for a logic level '0' from sequencer 3 (see step 26 above) (step 30). Upon receipt of the logic level '0', IMS 1 returns to step 21 and sends to sequencer 3 a trigger signal to commence the making of the next test of the series.

It will be seen that the transfer of the next test switch settings to shift register 7 by sequencer 3 occurs concurrently/in parallel with the sending of test signals and the receipt of responses thereto by IMS 1. Further, these operations occur in response to a single event, i.e. the sending of the trigger signal. The result is that the time taken to step through the entire series of tests is substantially reduced as compared to previously.

In the event that a very large number of switch settings is required to be stored in RAM 5, to avoid the use of expensive high speed RAM that would otherwise be required, the data defining these switch settings may be stored in conventional RAM in compressed form, i.e. with the redundancy contained therein removed. In this case decompression logic, under the control of sequencer 3, would be required in the data path from RAM 5 to shift register 7.

It is to be appreciated that in this application the expression 'electronic circuitry' includes electronic devices, loaded printed circuit boards, and unloaded printed circuit boards.

I claim:

1. An equipment for testing electronic circuitry comprising: test connections to sad circuitry; measurement means for generating test signals for application to sad circuitry and monitoring response signals produced by the circuitry in response to the test signals, said test signals being applied and said response signals being received by way of said test connections; switches for switching the test signals generated to said test connections and the response signals produced to said measurement means; means defining the settings of said switches for a current test of a series of tests required to be performed on said circuitry; first memory means for storing the switch settings for the next test of said series following said current test; second memory means for storing the switch settings for the entire series of tests; and sequencer means for transferring (i) the next switch settings from said first memory means to said means defining and (ii) the switch settings for the test of said series following said next test from said second memory means to said first memory means, said sequencer means initiating the transferring in response to the receipt of a trigger signal from said measurement means indicating that test signals for said next test will be applied to said circuitry after a predetermined time.

2. An equipment according to claim 1 wherein: whilst the sequencer means is transferring the switch settings it sends a busy signal to the measurement means indicating that it is in the process of so doing; and following (i) completion of the application of the test signals for said next test and the monitoring of the responses thereto and (ii) ceasing of the busy signal, said measurement means sends to said sequencer means a further trigger signal indicating that test signals for the test of said series following said next test will be applied to said circuitry after a predetermined time.

3. An equipment according to claim 1 wherein said second memory means comprises random access memory, and the data defining the switch settings for the entire series of tests is stored in the random access memory in compressed form, said equipment further comprising means for decompressing the data stored in the random access memory prior to its supply to said first memory means.

4. An equipment according to claim 1 wherein said first memory means comprises a shift register.

5. An equipment according to claim 1 wherein said means defining includes latch means.

6. An equipment according to claim 5 wherein said switches comprise a matrix of relay switches, and said means defining further includes relay drivers for operating said relay switches.

* * * * *